United States Patent
Ferguson et al.

(10) Patent No.: US 9,183,332 B2
(45) Date of Patent: Nov. 10, 2015

(54) METHOD FOR SIMULATION OF PARTIAL VLSI ASIC DESIGN

(71) Applicant: BAE Systems Information And Electronic Systems Integration Inc., Nashua, NH (US)

(72) Inventors: Richard Ferguson, Bealeton, VA (US); Lloyd Brown, Fredericksburg, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 14/251,267

(22) Filed: Apr. 11, 2014

(65) Prior Publication Data

US 2014/0325460 A1    Oct. 30, 2014

Related U.S. Application Data

(60) Provisional application No. 61/815,511, filed on Apr. 24, 2013.

(51) Int. Cl.
*G06F 17/50* (2006.01)

(52) U.S. Cl.
CPC .................................. *G06F 17/5036* (2013.01)

(58) Field of Classification Search
CPC ............ G06F 17/5077; G06F 2217/78; G06F 17/5045; G06F 17/5068; G06F 17/5022; G06F 17/5036; G06F 17/505; G06F 17/509; G06F 2217/04; G06F 2217/12; G06F 2217/80; G06F 2217/86
USPC .................................................. 716/100–106
See application file for complete search history.

(56) References Cited

U.S. PATENT DOCUMENTS

2004/0163058 A1 *   8/2004   Frank et al. ........................ 716/5
2008/0005704 A1 *   1/2008   Miloslavsky et al. ............. 716/2

* cited by examiner

*Primary Examiner* — Binh Tat
(74) *Attorney, Agent, or Firm* — Sand & Sebolt; Daniel J. Long

(57) ABSTRACT

A system and method for an automated way of running spice on a small portion of a design is presented. The system includes a sub-circuit netlist generation processor and an analog simulation processor. The sub-circuit netlist generation processor generates a sub-circuit netlist based, at least in part, on a HDL netlist, a parasitic capacitance database and trace rules. The sub-circuit netlist contains significantly fewer paths than the HDL netlist of an entire design so that its simulation time is much quicker. The analog simulation processor generates analog simulation results of the sub-circuit netlist based, at least in part, on dynamic inputs.

19 Claims, 3 Drawing Sheets

METHOD FOR SIMULATION OF PARTIAL VLSI ASIC DESIGN

CROSS REFERENCE TO RELATED APPLICATION

This application claims priority from U.S. Provisional Application Ser. No. 61/815,511, filed Apr. 24, 2013; the disclosure of which is incorporated herein by reference.

STATEMENT OF GOVERNMENT INTEREST

The invention was made with United States Government support under Contract No. 03-C-0216 awarded by a classified government agency. The United States Government has certain rights in this invention.

BACKGROUND OF THE INVENTION

1. Field of Invention

The current invention relates generally to apparatus, systems and methods for simulating electrical circuits. More particularly, the apparatus, systems and methods relate to simulating a portion of a circuit design. Specifically, the apparatus, systems and methods provide for simulation of a critical portion of a VLSI design to be fabricated in silicon as well as post silicon hardware debugging.

2. Description of Related Art

Large circuit designs such as those fabricated into an application specific integrated semiconductor (ASIC) can have millions of transistors and other electrical components that need to be tested. In order to produce a functioning chip, both the logic and the hardware need to be tested. Wire routes in the ASIC create inductance and capacitance that can affect voltages on components near them. Once these inductances and capacitances are known, simulation tools can create analog simulations of every component on the ASIC so that it can be more accurately tested.

Parasitic extraction is the calculation of the parasitic effects in both the electronic device and the required wiring interconnects between those devices. Parasitic values that need to be known are the geometries of electronic devices and wiring, parasitic capacitances, parasitic resistances and parasitic inductances. These types of values and parameters are often simply referred to as parasitics.

The major purpose of parasitic extraction is to create an accurate analog model of the circuit, so that detailed simulations can emulate actual digital and analog circuit responses. Digital circuit responses are often used to populate databases for signal delay and loading calculations such as: timing analysis; circuit simulation; and signal integrity analysis. Analog circuits are often run in detailed test benches to indicate if the extra extracted parasitics will still allow the designed circuit to function.

Interconnect capacitance is calculated by giving the extraction tool the following information: the top view layout of the design in the form of input polygons on a set of layers; a mapping to a set of devices and pins (from a Layout Versus Schematic run), and a cross sectional understanding of these layers. This information is used to create a set of layout wires that have added capacitors where the input polygons and cross sectional structure indicate a capacitor is needed. The output netlist contains the same set of input nets as the input design netlist and adds parasitic capacitor devices between these nets.

Interconnect resistance is calculated by giving the extraction tool the following information: the top view layout of the design in the form of input polygons on a set of layers, a mapping to a set of devices and pins, and a cross sectional understanding of these layers including the resistivity of the layers. This information is used to create a set of layout sub-wires that have added resistance between various sub-parts of the wires. The above interconnect capacitance is divided and shared amongst the sub-nodes in a proportional way. Note, that unlike interconnect capacitance, Interconnect resistance needs to add sub-nodes between the circuit elements to place these parasitic resistors. This can greatly increase the size of the extracted output netlist and can cause additional simulation problems. What is needed is a better way of simulating large circuit designs

SUMMARY

One aspect of an embodiment of the invention includes a system and method for an automated way of running an analog simulation on a small portion of a design. A system includes a sub-circuit netlist generation processor and an analog simulation processor. The sub-circuit netlist generation processor generates a sub-circuit netlist based, at least in part on an HDL netlist, a parasitic capacitance database and trace rules. The sub-circuit netlist contains many fewer paths that the HDL netlist of an entire design. The analog simulation processor generates analog simulation results of the sub-circuit netlist based, at least in part, on dynamic inputs.

Another embodiment provides for a sub-circuit simulation system. The system includes trace rules, a hardware descriptive language (HDL) tracer, an HDL to spice conversion processor, and a spice simulation processer. The trace rules describe a sub-circuit of a larger circuit design. The HDL tracer generates a partial sub-circuit netlist based, at least in part, on the trace rules. The HDL to spice conversion processor uses the sub-circuit netlist and parasitics of cells used in the sub-circuit netlist to create a sub-circuit spice netlist including parasitics of cells used in the sub-circuit netlist. The spice simulation processer generates sub-circuit SPICE simulation results of the sub-circuit spice netlist.

Another aspect of the invention is a method of simulating a sub-circuit. The method begins by generating from a full netlist of a full design a partial sub-circuit netlist. The generating the partial sub-circuit netlist is based, at least in part, on a set of trace rules that specify one or more of the group of: starting points and ending points. A partial spice netlist is generated from the partial sub-circuit netlist. This is performed as discussed later. The spice netlist is simulated to generate analog output data. The netlist may be simulated using SPICE analog simulation tool.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

For this particular invention it is helpful to understand a bit more about how large circuits such as microprocessors, ASICs and the like are currently designed before introducing the preferred embodiment of a system and method for the improvement in designing large circuits. Currently, a sub-circuit representing a portion of a larger design containing thousands, millions or even more transistors and other electrical components is manually constructed by a design engineer. Building this sub-portion of a much larger circuit requires the designer to manually build it by selecting components from a software "toolbox" of components that include different types of transistors, capacitors, resistors and the like. Through graphical user interfaces (GUIs) the designer then manually places these components of this sub-circuit into place in a computer file representing the sub-circuit. Wires (or different metal layers) also need to be manually placed to properly connect all of these components. For accurate simulation, the designer also needs to specify wire lengths and widths so that the simulator can determine accurate parasitics.

Depending on the type of design, the designer may need to add other parasitics and/or constraints to the sub-circuit to be sure it is accurately simulated. Once this tedious process is completed this sub-circuit is then simulated in the analog domain using a simulator such as Simulation Program with Integrated Circuit Emphasis (SPICE). The method described above is a very slow and complex effort with significant manual interpretation and construction of the sub-circuit. This can lead to inaccurate simulation results and prolonged debug activities.

Figure 1:
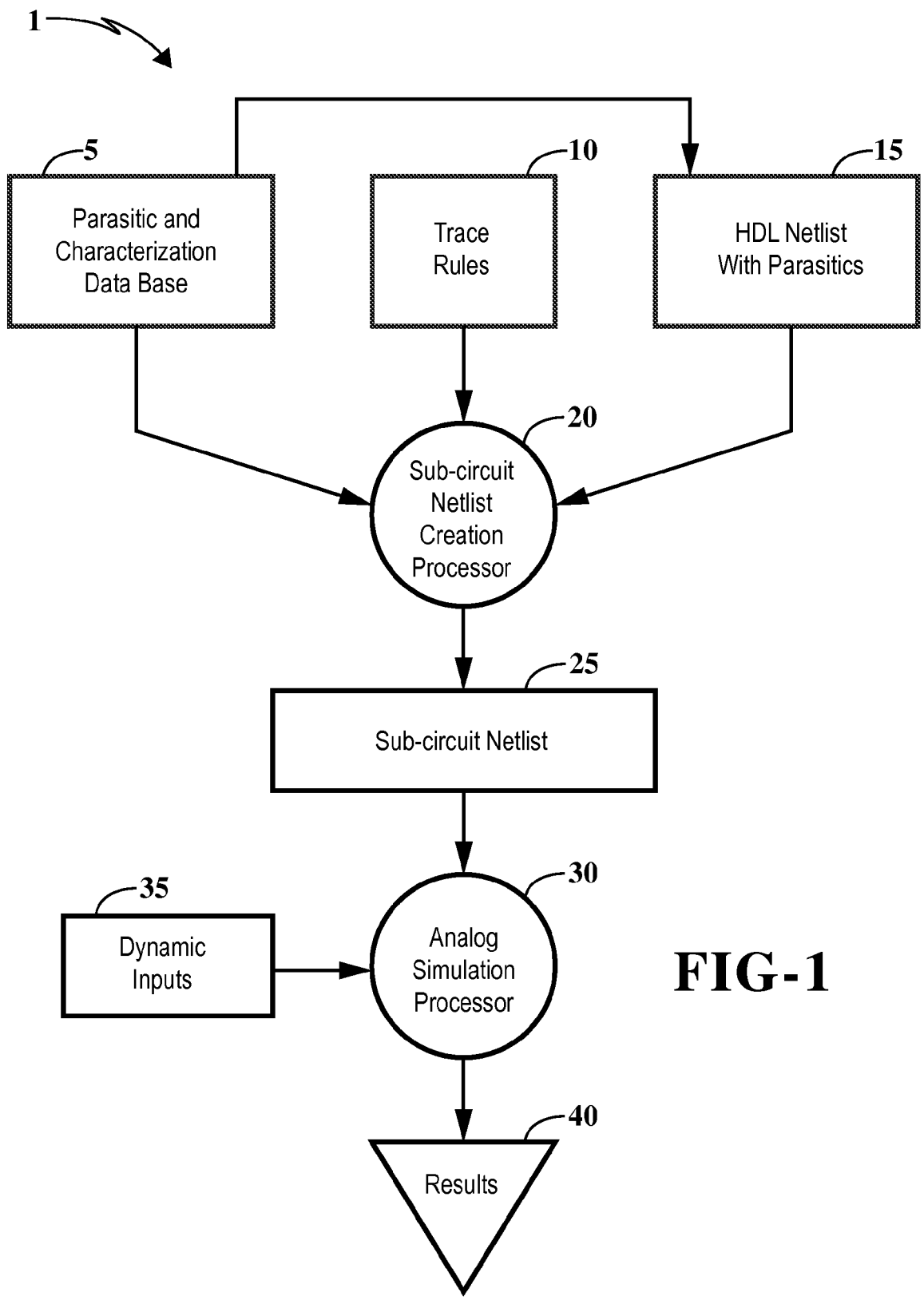
FIG. 1 illustrates a preferred embodiment of system that analog simulates a partial sub-circuit of a much larger design.

The preferred embodiment illustrated in FIG. 1 provides for a sub-circuit simulation system 1 which allows for the creation and simulation of only a small sub-circuit portion of a full VLSI ASIC or other circuit design that is constructed quickly and that nearly matches hardware. This provides several improvements over prior art systems. The sub-circuit simulation system 1 of FIG. 1 reduces interpretation error introduced by the design engineer attempting to replicate the hardware in question in a software modeled sub-circuit. This sub-circuit simulation system 1 also improves the accuracy of the analog simulation by using a very close electronic representation of the design components input to all pieces of the simulation. This system 1 aids in the debug or design of VLSI ASIC products by extracting the critical path sub-circuits of design logic and accurately simulates them with an analog simulator with full parasitic characterization.

The system 1 includes four input files: the parasitic and characterization database 5, the trace rules 10, the hardware descriptive language (HDL) netlist with parasitics 15 and the dynamic input files 35. The system 1 further includes a sub-circuit analog netlist generation processor 20 that creates a sub-circuit netlist 25 and an analog simulation processor 35 that produces the results files 40. The sub-circuit netlist generation processor 20 and an analog simulation processor 35 can be implemented in a variety of ways including using hardware logic and/or software logic.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a processor such as a software controlled microprocessor, discrete logic, an application specific integrated circuit (ASIC), a programmed logic device, a memory device containing instructions, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Having introduced the components of the system 1 their use and functionality will now be described. In general, the parasitic and characterization database 5 include all the parasitics needed to characterize a cell representing a NAND gate, NOR gate, latch, flip-flop and the like. This database 5 also includes timing and logic function data for the gates (e.g., cells) as well as directional data such as specifying inputs and outputs I/O of each cell. The parasitic information of this database is generally determined when a processes for manufacturing these gates is developed and is not generally changed by the designer using them. However, the designer would specify the trace rules 10 and then create the HDL of the design.

The designer would create an HDL netlist that is modeled in the HDL netlist with parasitics file 15. The parasitics of this file are generally automatically generated from the HDL netlist after it is created and it contains information on how gates are generally placed along with coupling information for connections between gates/cells.

The trace rules file 10 is a novel concept of this system 1. Unlike prior art systems where the designer had to manually create SPICE models that were separate from the overall design, the trace rules file 10 allows the designer to set rules that instruct the sub-circuit netlist generation processor 20 (discussed later) how to build a netlist containing just sub-circuits (e.g., critical paths) of special interest rather than creating an analog netlist that includes the entire design.

The trace rules 10 can include any rule that tells the sub-circuit netlist generation processor 20 what gates to include in the sub-circuit analog netlist 25. For example, a first trace rule can specify a path that is to be simulated from an I/O pin to a first latch or a first flip-flop and then to stop. A second rule can specify to create path between to latches but not beyond those two latches. A third trace rule can specify to start at a particular gate and to create netlist through 5 levels of logic from that gate and then to stop. Another trace rule can specify to only create a netlist of one input of a NAND gate. Another rule specifies to start at a certain point and if a certain type of gate is reached then to end this portion of the netlist.

In a bit more detail, an example implementation of the trace rules are now examined. The trace rules are defined in two files. The first dictates where the trace begins, these are instance names from the design. The second dictates where the trace stops, this is the more complex file as it can contain both instance names and book types. The example listed below emulates a clock tree trace. The "#" symbols indicates a comment the example trace rules:

Starting Instance File Example:

---

```
# Start tracing from SYSCLK pin
# io_pin_sysclk is the instance name of the IO book con-
   nected
# to pin_SYSCLK
io_pin_sysclk # pin_SYSCLK
```

---

This file is simply a list of instance names. A trace will be triggered from each specified instance, and the final trace output will be combined.

Stopping Rules File Example:

---

```
# Only trace RCVR_OUT port from instances of book type
   'padio'
# io_pin_sysclk is of type 'padio'
B padio RCVR_OUT
# Stop tracing at all instances of book type 'reg'
B reg
# Only trace CLK_OUT port from instance 'pll'
I pll CLK_OUT
```

---

This file has four types of trace rules:
1) B <book_name> # stop at all instances of book type 'book_name'
2) B <book_name> <port1> <port2> ... <portN> # stop at all instances of book type 'book_name' and only trace specified output ports
3) I <instance_name> # stop at instance 'instance_name'
4) I <instance_name> <port1> <port2> ... <portN> # stop at instance 'instance_name' and only trace specified output ports For this example, a forward trace is taking place from the pin_SYSCLK to all registers in the design. The trace is started with the io_pin_sysclk definition in the instance start file. The trace is then immediately limited to the RCVR_OUT port of the IO book by the first trace rule. The trace algorithm will then follow the path forward from RCVR_OUT. In this example, the SYSCLK I/O book is connected to the PLL directly, which will trigger the last trace rule where only the CLK_OUT port from the PLL instance will be traced forward. From this point, the trace algorithm fans out the clock tree tracing all output ports of all encountered instances until the trace algorithm finds a register instance as defined in the second trace rule. If an instance is encountered that doesn't match a rule, all outputs are traced. For example, there is typically a tree of clock buffers or clock inverters that balance arrival times of the clock to all registers. Since these buffers and inverters do not have trace rules, the trace algorithm will then trace all outputs automatically and will only stop once the trace algorithm reached an instance of type 'reg'.

Additionally, the trace can either be done in a forward mode or reverse mode. The clock tree example would be in a forward mode where the trace algorithm follows the outputs of each instance the trace algorithm comes across. In reverse mode, the trace algorithm traces all inputs of each instance the trace algorithm comes across. An example is tracing the logic between two registers, and then following the clock tree from each register back to a common node. The trace starts at the capture register, and traces the data inputs to the source registers. Then clock ports are added to each register trace rule so the clock tree will trace to a common node, which would be defined with a stop trace rule. When a simulation is later performed with a single clock source the simulation results can determine how clock skew affects the behavior of the circuit.

By default, when tracing in a reverse direction, all loads are not always captured in the trace output. When tracing in an "accurate loading mode", once the trace algorithm has completed and determined the desired cone of logic, the trace algorithm traces every instance one level of logic forward. This then captures all loading nodes of each desired signal.

The sub-circuit netlist generation processor 20 uses all of the specified trace information to create a sub-circuit analog netlist 25 that only includes the paths of interest, not the paths for the entire design. As discussed below with reference to FIG. 1, the sub-circuit netlist generation processor 20 may create the sub-circuit analog netlist 25 in two steps. First, the sub-circuit netlist generation processor 20 can use an HDL netlist tracer to create a partial HDL netlist that just contains the circuits of interest. Secondly, the sub-circuit generation netlist generation processor 20 will combine this partial HDL netlist with parasitic information to create the partial analog netlist that just contains the circuits of interest.

The analog simulation processor 30 creates an analog simulation using the sub-circuit analog netlist 25 and the dynamic inputs 35 and creates a results files 40. The analog simulation processor 30 can be running a version of SPICE to create the analog result files 40. The results 40 are then reviewed by the design engineer to see of the sub-circuits of interest are performing as desired.

In Summary, the design engineer essentially only needs to create the trace rules file 10 in order to generate an analog simulation of a sub-circuit (as specific by the trace rules 10). This sub-circuit simulation system 1 has proven to be very useful to quickly design clock trees and other circuits where analog simulation is needed before (and sometimes after) the final product is produced. This saves both time and money and reduces the chance for errors because now the designer does not have to create his own hand-crafted separate sub-circuit for analog simulation. This sub-circuit is now automatically created by the sub-circuit simulation system 1 for the design engineer so that there is no way for the designer to inject errors into his own sub-circuit that is independent of the overall designed project. Running analog simulation on just the sub-circuit of interest saves time because often this sub-circuit is a very small fraction of the total design. Large designs can run for days and a smaller sub-circuit may only require minutes of netlist creation time and simulation time.

Figure 2:
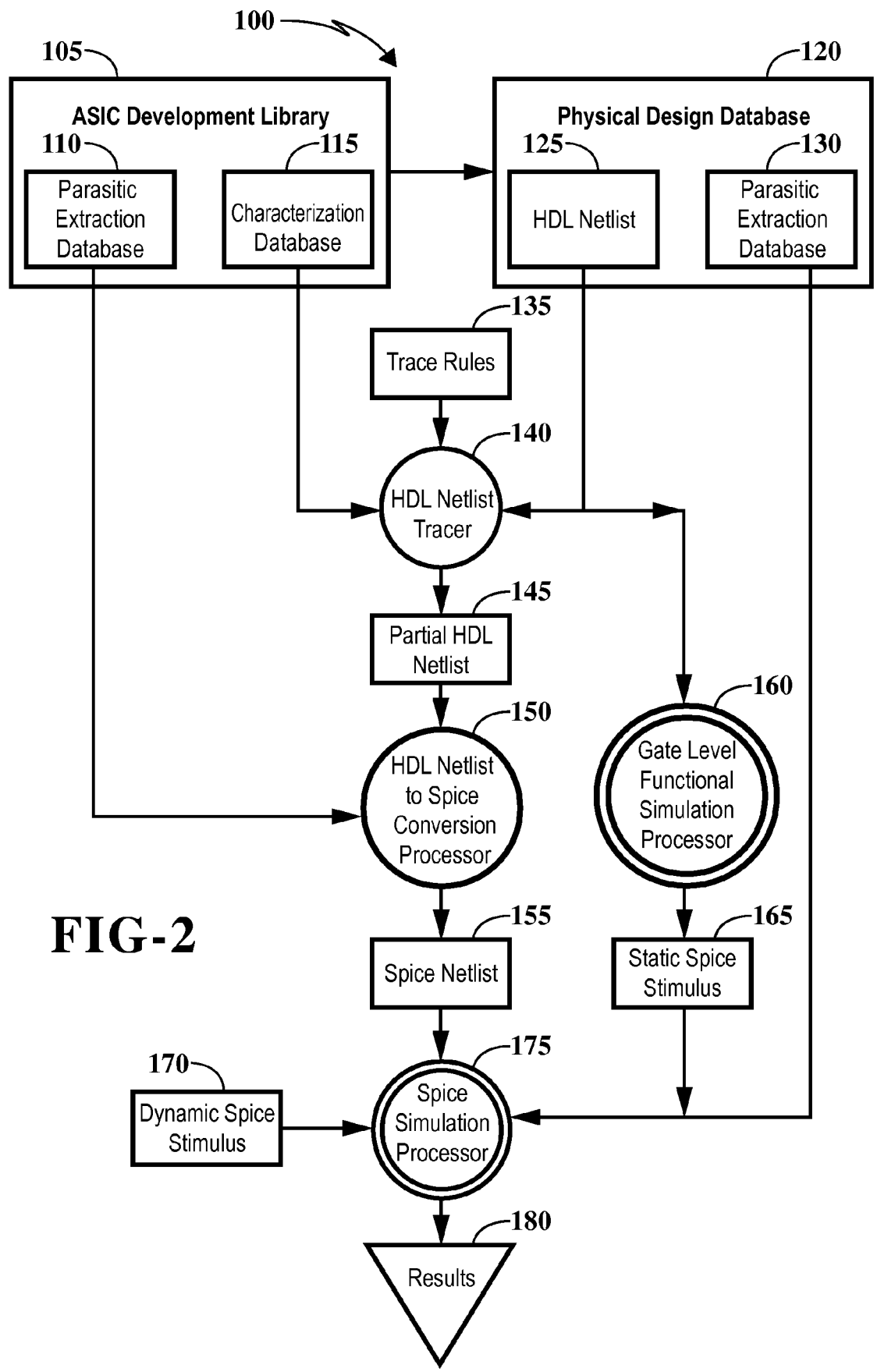
FIG. 2 illustrates another embodiment of system that analog simulates a partial sub-circuit of a much larger design.

FIG. 2 illustrates another working example of a system for simulation of a sub-circuit 100 of a much larger design. This system 100 includes an ASIC development library 105 that includes a parasitic extraction database 110 and a characterization database 115 of the cells/gates of a particular design. The system 100 also includes a physical design database 120 that includes an HDL netlist 125 of the entire design and a parasitic extraction database 130. The system for simulation of a sub-circuit 100 further includes a file of trace rules 135, an HDL netlist tracer 140 that produces a partial HDL netlist 145, an HDL to spice conversion processor 150 that produces a spice netlist 155 and a gate level function simulation processor 160 that produces a static stimulus file 165. The system 100 also includes a spice simulation processor 175 that receives the spice netlist 155, the static spice stimulus 165 and a dynamic spice stimulus 170 and produces a results file 180.

The file of trace rules 135 contains trace rules similar to the trace rules discussed above that instruct the system for simulation of a sub-circuit 100 to only construct sub-circuits of interest so that only a fraction of the entire design is simulated. The parasitic extraction database 130 of the physical design database 120 contains parasitics of routing between cells. The HDL netlist tracer 145 of the system for simulation of a sub-circuit 100 utilizes a VTracer tool but it can also be another type of HDL netlist tracers. The HDL netlist to spice conversion processor 150 is a vd2spice.pl tool but in other embodiments it can be other converters as understood by those of ordinary skill in this art.

Having described the components of the system for simulation of a sub-circuit 100 of FIG. 2, its use and operation is now described. The process of creating a spice simulation of a sub-circuit that may be a tiny fraction of an overall circuit design begins when a design engineer enters trace rules into the file of trace rules 135 as discussed above. These trace rules 135 along with the characteristic database 115 and the entire HDL netlist 125 are input the HDL netlist tracer 140. The HDL netlist tracer 140 generates a partial HDL netlist 145 that just contains the circuit paths specified by the trace rules 135. In one configuration of the preferred embodiment the partial HDL netlist 145 is in custom HDL format but in other configurations it can be any other HDL format.

The partial HDL netlist 145 is input to the HDL netlist to spice conversion processer 150. The HDL netlist to spice conversion processer 150 uses this netlist and the parasitic extract database 110 of the ASIC development library 105 to generate the partial spice netlist 155 that represents just the portion of the design specified by the trace rules 135. The partial spice netlist 155 includes full sub-circuit parasitic information. The gate level functional simulation processor 160 uses the HDL netlist 125 to generate static spice stimulus values 165 that are placed on unused inputs and other lines that are not used by the sub-circuit.

Using the spice netlist 155, static spice stimulus 165 and the dynamic spice stimulus 170 the spice simulation processor 175 runs a SPICE simulation of just the small sub-circuit portion of entire design and outputs simulation results 180 that can then be analyzed by the design engineer. The parasitic extraction database 130 can, in other configurations, also be input to the spice simulation processor 175 to more accurately model parasitics.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 3:
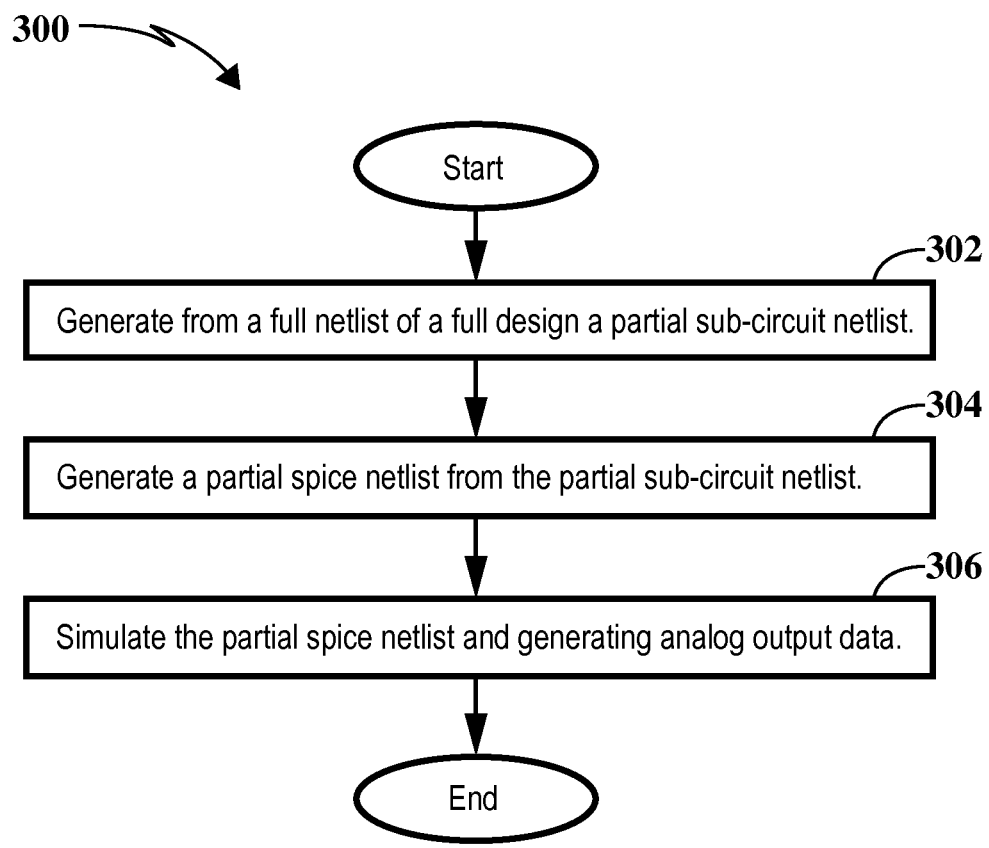
FIG. 3 illustrates an embodiment of a method for analog simulating a partial sub-circuit of a much larger design.

FIG. 3 illustrates a method 300 of simulating a sub-circuit. The method 300 begins by generating from a full netlist of a full design a partial sub-circuit netlist, at 302. The generating the partial sub-circuit netlist is based, at least in part, a set of trace rules that specify one or more starting points and ending points. A partial spice netlist is generated, at 304, from the partial sub-circuit netlist. This is performed as discussed above. The spice netlist is simulated, at 306, to generate analog output data. The netlist may be simulated using SPICE.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A system comprising:
   trace rule file containing trace rules describing a sub-circuit of a larger circuit design;
   a sub-circuit netlist generation processor configured to generate a sub-circuit netlist, a portion of which is based on a hardware descriptive language (HDL) netlist of the larger circuit design, a parasitic capacitance database and the trace rules, wherein the trace rules instruct the sub-circuit netlist generation processor how to build the sub-circuit netlist so that the sub-circuit netlist contains only sub-circuits of special intrest rather than create an analog netlist that includes the entire larger circuit design, whereby the sub-circuit netlist contains fewer circuit paths than the HDL netlist of the larger circuit design;
   an analog simulation processor configured to generate analog simulation results of the sub-circuit netlist based on dynamic inputs; and
   a gate level functional simulation processor configured to generate static stimulus of the HDL netlist, wherein the analog simulation processor is configured to generate the analog simulation results based, at least in part, on the static stimulus.

2. The system of claim 1 wherein the trace rules comprise:
   a trace rule which instructs the sub-circuit netlist generation processor to specify a path from an output pin to a first latch or a first flip-flop and then to stop.

3. The system of claim 1 wherein the trace rules comprise:
   a trace rule which instructs the sub-circuit netlist generation processor specify a path between two latches but not beyond the two latches.

4. The system of claim 1 wherein the trace rules comprise:
   a trace rule which instructs the sub-circuit netlist generation processor to start at a starting gate and to generate a sub-circuit netlist through a number of levels of logic beyond the starting gate and then to stop.

5. The system of claim 1 wherein the trace rules comprise:
   a trace rule which instructs the sub-circuit netlist generation processor to generate paths which start from a single input of a NAND gate.

6. The system of claim 1 wherein the analog simulation processor comprises:

a version of a Simulation Program with Integrated Circuit Emphasis (SPICE), wherein the analog simulation processor uses SPICE to generate the analog simulation results.

7. The system of claim 1 wherein sub-circuit netlist generation processor comprises:
a VTracer, wherein the sub-circuit netlist generation processor generates the sub-circuit netlist using the VTracer.

8. The system of claim 1 wherein the sub-circuit netlist contains a number of circuit paths which is less than half of a number of circuit paths contained in the HDL netlist of the larger circuit design.

9. The system of claim 1 wherein the sub-circuit netlist contains a number of circuit paths which is less than five percent of a number of circuit paths contained in the HDL netlist of the larger circuit design.

10. The system of claim 1 wherein each of the trace rules instructs the sub-circuit netlist generation processor where to start a specified trace and where to stop the specified trace.

11. The system of claim 1 wherein the trace rules tell the sub-circuit netlist generation processor what gates to include in the sub-circuit netlist.

12. The system of claim 1 wherein the trace rules comprise a trace rule which instructs the sub-circuit netlist generation processor to start at a certain point and if a certain instance or certain type of book is reached, then to stop.

13. The system of claim 1 wherein the trace rules comprise a trace rule which instructs the sub-circuit netlist generation processor to start at a certain point and if a certain instance or certain type of book is reached, then to only trace specified ports from the certain instance or certain type of book.

14. A sub-circuit simulation system comprising:
a trace rule file containing, trace rules describing a sub-circuit of a larger circuit design;
a hardware descriptive language (HDL) tracer configured to generate a partial sub-circuit netlist at least partially based on the trace rules; wherein the trace rules instruct the tracer how to build the partial sub-circuit netlist so that the partial sub-circuit netlist contains only sub-circuits of special interest rather than create an analog netlist that includes the entire larger circuit design;
an HDL to spice conversion processor configured to use the partial sub-circuit netlist and parasitics of cells used in the partial sub-circuit netlist to create a sub-circuit spice netlist including parasitics of cells used in the partial sub-circuit netlist;
a spice simulation processor configured to generate sub-circuit Simulation Program with Integrated Circuit Emphasis (SPICE) simulation results of the sub-circuit spice netlist; and a gate level functional simulation processor configured to generate static spice stimulus based, at least in part, on the HDL netlist, wherein the spice simulation processor generates the sub-circuit SPICE simulation results based on the static spice stimulus.

15. The sub-circuit simulation system of claim 14 further comprising:
a parasitic extraction database with parasitics of wiring between cells, wherein the spice simulation processor is configured to use the parasitic extraction database when generating the sub-circuit SPICE simulation results.

16. The sub-circuit simulation system of claim 14 further comprising:
a characterization database that characterizes gates, wherein the HDL netlist tracer creates the partial sub-circuit netlist based on the characterization database.

17. The sub-circuit simulation system of claim 16 wherein the characterization database comprises:
functional information of the gates and directional data information about the gates.

18. A method of simulating a sub-circuit comprising:
generating from a full netlist of a full circuit design a partial sub-circuit netlist by instructing a sub-circuit netlist generation processor with a set of trace rules how to build the partial sub-circuit netlist so that the partial sub-circuit netlist contains only sub-circuits of special interest rather than creating an analog netlist that includes the full circuit design, wherein the set of traces rules specify a starting point and an ending point of a circuit path;
with a netlist to spice conversion processor, generating a partial spice netlist from the partial sub-circuit netlist with a gate level functional simulation processor, generating static stimulus of the full netlist;
with an analog simulation processor, simulating the partial spice netlist to generate analog output data based, at least in part, on the static stimulus; and
debugging the sub-circuit based on the output data.

19. The method of claim 18 wherein generating the partial spice netlist comprises generating the partial spice netlist to include parasitic information from a parasitic extraction database.

* * * * *